United States Patent
Jeter et al.

(10) Patent No.: US 9,697,145 B2
(45) Date of Patent: Jul. 4, 2017

(54) MEMORY INTERFACE SYSTEM

(71) Applicant: Apple Inc., Cupertino, CA (US)

(72) Inventors: Robert E. Jeter, Santa Clara, CA (US); Neeraj Parik, San Jose, CA (US)

(73) Assignee: Apple Inc., Cupertino, CA (US)

( * ) Notice: Subject to any disclaimer, the term of this patent is extended or adjusted under 35 U.S.C. 154(b) by 47 days.

(21) Appl. No.: 14/738,265

(22) Filed: Jun. 12, 2015

(65) Prior Publication Data

US 2016/0364345 A1    Dec. 15, 2016

(51) Int. Cl.
*G06F 12/00*    (2006.01)
*G06F 13/00*    (2006.01)
(Continued)

(52) U.S. Cl.
CPC .......... *G06F 13/161* (2013.01); *G06F 12/023* (2013.01); *G06F 12/0646* (2013.01);
(Continued)

(58) Field of Classification Search
CPC ............... G06F 12/023; G06F 12/0238; G06F 12/0246; G06F 12/0253; G06F 12/0646;
(Continued)

(56) References Cited

U.S. PATENT DOCUMENTS 4,954,988 A * 9/1990 Robb .................... G11C 7/1078
 365/189.02
5,696,923 A * 12/1997 Robertson ................. G06F 3/14
 711/100

(Continued)

OTHER PUBLICATIONS

A Cooperative Management Scheme for Power Efficient Implementations of Real-Time Operating Systems on Soft Processors; Ou et al; IEEE Transactions on Very Large Scale Integration (VLSI) Systems, vol. 16, iss. 1; Jan. 2008; pp. 45-56 (12 pages).*

(Continued)

*Primary Examiner* — Daniel C Chappell
(74) *Attorney, Agent, or Firm* — Meyertons, Hood, Kivlin, Kowert & Goetzel, P.C.

(57) ABSTRACT

In some embodiments, a memory interface system includes a memory interface circuit and a memory controller. The memory interface circuit is configured to communicate with a memory device. The memory controller is configured, in response to the memory device operating at a first frequency, to store configuration information corresponding to the memory device operating at a second frequency. The memory controller is further configured, in response to the memory device transitioning to the second frequency, to send the configuration information to the memory interface circuit. In some embodiments, storing the configuration information may result in some memory requests being provided to the memory device more quickly, as compared to a different memory interface system where the configuration information is not stored at the memory controller. Additionally, in some embodiments, storing the configuration information may result in the configuration information being transmitted to the memory interface circuit more efficiently.

19 Claims, 5 Drawing Sheets

(51) Int. Cl.
| | |
|---|---|
| *G06F 13/28* | (2006.01) |
| *G06F 13/16* | (2006.01) |
| *G06F 12/02* | (2006.01) |
| *G06F 12/06* | (2006.01) |
| *G11C 7/10* | (2006.01) |
| *G11C 8/18* | (2006.01) |
| *G11C 29/02* | (2006.01) |

(52) U.S. Cl.
CPC .............. *G11C 7/1072* (2013.01); *G11C 8/18* (2013.01); *G11C 29/022* (2013.01); *G11C 29/023* (2013.01); *G11C 29/028* (2013.01); *G06F 2212/1044* (2013.01); *G11C 7/1045* (2013.01); *G11C 7/1066* (2013.01)

(58) Field of Classification Search
CPC .. G06F 12/06; G06F 12/0638; G06F 12/0653; G06F 12/0661; G06F 12/0669; G06F 12/0676; G06F 12/0684; G06F 12/0692; G06F 13/14; G06F 13/16; G06F 13/161; G06F 13/1615; G06F 13/1621; G06F 13/1626; G06F 13/1631; G06F 13/1636; G06F 13/1642; G06F 13/1647; G06F 13/1652; G06F 13/1657; G06F 13/1663; G06F 13/1668; G06F 13/1673; G06F 13/1678; G06F 13/1684; G06F 13/1689; G06F 13/1694; G06F 13/18; G06F 2212/1016; G06F 2212/1021; G06F 2212/1024; G06F 2212/1041; G06F 2212/1044; G11C 7/1072; G11C 8/18
USPC .......................................................... 711/170
See application file for complete search history.

(56) References Cited

U.S. PATENT DOCUMENTS

| | | | | | |
|---|---|---|---|---|---|
| 6,201,740 | B1* | 3/2001 | Seyyedy | ............... | G11C 7/1072 365/185.13 |
| 6,279,116 | B1* | 8/2001 | Lee | ...................... | G11C 7/1018 711/167 |
| 6,681,337 | B1* | 1/2004 | Smith | .............. | G01R 31/31725 365/194 |
| 6,810,475 | B1* | 10/2004 | Tardieux | ................... | G06F 5/01 712/217 |
| 7,107,475 | B1* | 9/2006 | Amick | ..................... | G06F 1/12 327/158 |
| 7,624,225 | B2* | 11/2009 | Gower | ..................... | G11O 5/04 711/105 |
| 2003/0131281 | A1* | 7/2003 | Jung | .................. | G06F 11/1666 714/13 |
| 2004/0133767 | A1 | 7/2004 | Chaudhry et al. | | |
| 2004/0148482 | A1* | 7/2004 | Grundy | ................... | G06F 12/06 711/167 |
| 2008/0235444 | A1* | 9/2008 | Gower | ..................... | G11O 5/04 711/105 |
| 2009/0006774 | A1* | 1/2009 | Bartley | ............... | G06F 13/1684 711/154 |
| 2009/0006781 | A1* | 1/2009 | Bartley | ............... | G06F 13/1689 711/154 |
| 2014/0208126 | A1* | 7/2014 | Mooney | .................. | G06F 13/14 713/300 |
| 2014/0215112 | A1* | 7/2014 | Iyer | ..................... | G06F 12/0831 710/106 |
| 2014/0247637 | A1* | 9/2014 | Best | ........................ | G11C 5/02 365/51 |
| 2014/0281625 | A1* | 9/2014 | Younger | ............... | G06F 1/3206 713/323 |
| 2015/0256187 | A1* | 9/2015 | Hwang | ................ | H03L 7/0802 365/194 |

OTHER PUBLICATIONS

A novel buffer circuit for energy efficient signaling in dual-VDD systems; Kaul et al; Proceedings of the 15th ACM Great Lakes symposium on VLSI ; Apr. 17-19, 2005; pp. 462-467 (6 pages).*

Design and selection of buffers for minimum power-delay product; Turgis et al; Proceedings of the 1996 European conference on Design and Test ; Mar. 11-14, 1996; pp. 224-228 (5 pages).*

An interface-circuit synthesis method with configurable processor core in IP-based SoC designs; Kohara et al; Proceedings of the 2006 Asia and South Pacific Design Automation Conference; Jan. 24-27, 2006; pp. 594-599 (6 pages).*

DLL/PLL on a DRAM, http://www.rambus.com/documentation/inventions/item/759-dll-pll-on-a, 4 pages. [Retrieved Mar. 23, 2015].

* cited by examiner

MEMORY INTERFACE SYSTEM

BACKGROUND

Technical Field

This disclosure relates generally to a memory interface system.

Description of the Related Art

In many memory systems, such as various double data rate (DDR) systems, a clock signal known as a data strobe is transmitted along with data signals. Data signals received at the memory may be synchronized to the data strobe.

As clock speeds increase, inherent delays between the data strobe and the data may cause errors. Such delays may be exacerbated by voltage and temperature variations. In some cases, delay elements may add delays to the data strobe, the data signals, or both to align the data strobe to the data signals. However, calibrating the delay elements may occupy resources that could otherwise be used by the memory system, which may negatively affect system performance.

SUMMARY

In various embodiments, a memory interface system is disclosed that includes a memory interface circuit and a memory controller. The memory interface circuit may communicate with a memory device (e.g., to pass memory requests to the memory device). In some embodiments, while the memory device is operating at a first frequency, the memory controller may intercept and store (e.g., in one or more registers such as shadow registers) configuration data that addresses the memory interface circuit and corresponds to the memory device operating at a second frequency. In response to the memory device transitioning to the second frequency, the memory controller may issue or send the configuration data to the memory interface circuit.

In some embodiments, the configuration data may be issued from the memory controller to the memory interface circuit using the same set of connections as is used to provide requests to the memory device (the configuration data, however, may not be issued at the same time as a request in some cases). As a result, in some cases, while the memory device is operating at the first frequency, some requests may be provided to the memory device more quickly as compared to a system where the configuration data is not intercepted and stored at the memory controller. Further, in some embodiments, because the memory device may be unable to service requests while transitioning to the second frequency, issuing the configuration data from the memory controller to the memory interface circuit in response to the memory device transitioning to the second frequency may result in reduced or no delay to data requests to the memory device due to the issuing the configuration data. Additionally, in some embodiments, multiple sets of configuration data may be intercepted and accumulated while the memory device is operating at the first frequency. In some embodiments, the accumulated configuration data may be sent more quickly (e.g., because less handshaking may occur and/or due to packet sizing), as compared to a system where the configuration data is not intercepted and stored.

This disclosure includes references to "one embodiment," "a particular embodiment," "some embodiments," "various embodiments," or "an embodiment." The appearances of the phrases "in one embodiment," "in a particular embodiment," "in some embodiments," "in various embodiments," or "in an embodiment" do not necessarily refer to the same embodiment. Particular features, structures, or characteristics may be combined in any suitable manner consistent with this disclosure.

Various units, circuits, or other components may be described or claimed as "configured to" perform a task or tasks. In such contexts, "configured to" is used to connote structure by indicating that the units/circuits/components include structure (e.g., circuitry) that performs those task or tasks during operation. As such, the unit/circuit/component can be said to be configured to perform the task even when the specified unit/circuit/component is not currently operational (e.g., is not on). The units/circuits/components used with the "configured to" language include hardware—for example, circuits, memory storing program instructions executable to implement the operation, etc. Reciting that a unit/circuit/component is "configured to" perform one or more tasks is expressly intended not to invoke 35 U.S.C. §112(f), for that unit/circuit/component. Additionally, "configured to" can include generic structure (e.g., generic circuitry) that is manipulated by software and/or firmware (e.g., an FPGA or a general-purpose processor executing software) to operate in a manner that is capable of performing the task(s) at issue. "Configured to" may also include adapting a manufacturing process (e.g., a semiconductor fabrication facility) to fabricate devices (e.g., integrated circuits) that are adapted to implement or perform one or more tasks.

As used herein, the term "based on" describes one or more factors that affect a determination. This term does not foreclose additional factors that may also affect the determination. That is, a determination may be solely based on those factors or based, at least in part, on those factors. Consider the phrase "determine A based on B." While in this case, B is a factor that affects the determination of A, such a phrase does not foreclose the determination of A from also being based on C. In other instances, A may be determined based solely on B. Additionally, where B includes multiple elements (e.g., multiple data values), A is determined based on B as long as at least one of the elements of B affects the determination of A.

As used herein, the phrase "in response to" describes one or more factors that trigger an effect. This phrase does not foreclose additional factors that may also affect or otherwise trigger the effect. That is, an effect may be solely in response to those factors, or may be in response to those factors as well as in response to other factors. Consider the phrase "perform A in response to B." While in this case, B is a factor that triggers the performance of A, such a phrase does not foreclose the performance of A from also being in response to C. In other instances, A may be performed solely in response to B.

As used herein, the terms "first," "second," etc. are used as labels for nouns that they precede, and do not imply any type of ordering (e.g., spatial, temporal, logical, etc.). For example, in a storage device having eight storage locations, the terms "first storage location" and "second storage location" can be used to refer to any two of the eight storage locations.

DETAILED DESCRIPTION

As described above, a memory interface system that includes a memory controller and a physical layer (PHY) circuit may provide memory requests to a memory device. Additionally, the PHY circuit may store configuration information used to facilitate communications with the memory device (e.g., delay information used to synchronize signals between the PHY circuit and the memory device). The memory device may be configured to operate differently during a first system state, as compared to a second system state (e.g., a state where the memory device operates at a first frequency and a state where the memory device operates at a second, higher, frequency). In some embodiments, the PHY circuit may use different configuration information to facilitate communications with the memory device when the memory device is operating during the first system state, as compared to the second system state. In some cases, the PHY circuit may be unable to communicate with the memory device until it receives configuration information corresponding to a state of the memory device.

The memory controller may receive configuration information that addresses the PHY circuit and may relate to operation of the PHY circuit during a different, future system state (e.g., a state where the memory device operates at a different frequency). However, because the configuration information does not relate to a current system state, forwarding the configuration information to the PHY circuit prematurely may result in unnecessarily delaying one or more of the memory requests. For example, storing the configuration information at the PHY circuit may interfere with the PHY circuit communicating with the memory device until the memory device switches into the different system state. Moreover, in some cases, the memory device may be unable to process memory requests while switching into the different system state.

As will be described below, a memory controller may include one or more registers that temporarily store configuration information for a future operating state of a memory device until the memory device transitions to that operating state and the information is needed by the PHY circuit. As used herein, the term "register" refers generally to any suitable circuitry that is configured to store one or more bits of data. In various embodiments discussed below, the registers of the memory controller may be referred to as "shadow registers" that correspond to registers located in the PHY circuit that store the PHY circuit's configuration information. As used herein, the term "shadow register" refers to a register that is configured to temporarily store data addressed to another register. In some embodiments, a shadow register is a non-architecturally defined register that temporarily stores data for an architecturally defined register. While the memory controller stores the configuration information, in various embodiments, the memory controller and the PHY circuit continue to service read and write requests until the memory device transitions state. Once the memory device transitions to the new operating state (or during the transition), the memory controller sends the stored configuration information to the PHY circuit, so the PHY circuit can begin communicating with the memory device operating at the new state.

Storing the configuration information at a location close to the PHY circuit (e.g., at the memory controller in one or more registers) may result in the PHY circuit communicating with the memory device more quickly after the memory device changes states, as compared to a system where the configuration data is stored further away from the PHY circuit (e.g., at a power management unit). In various embodiments, continuing to service memory request as configuration information is received (as opposed to stopping memory traffic) may also mitigate a potential deadlock scenario in which data necessary for completing the state change is trapped in the memory device.

As will also be described, in some embodiments, the memory controller may be configured to collect blocks of received configuration information over a longer interval and then send collected configuration information as a batch packet to the PHY circuit. This may beneficially use fewer transmissions than communicating the data as it is received at the memory controller.

Figure 1:
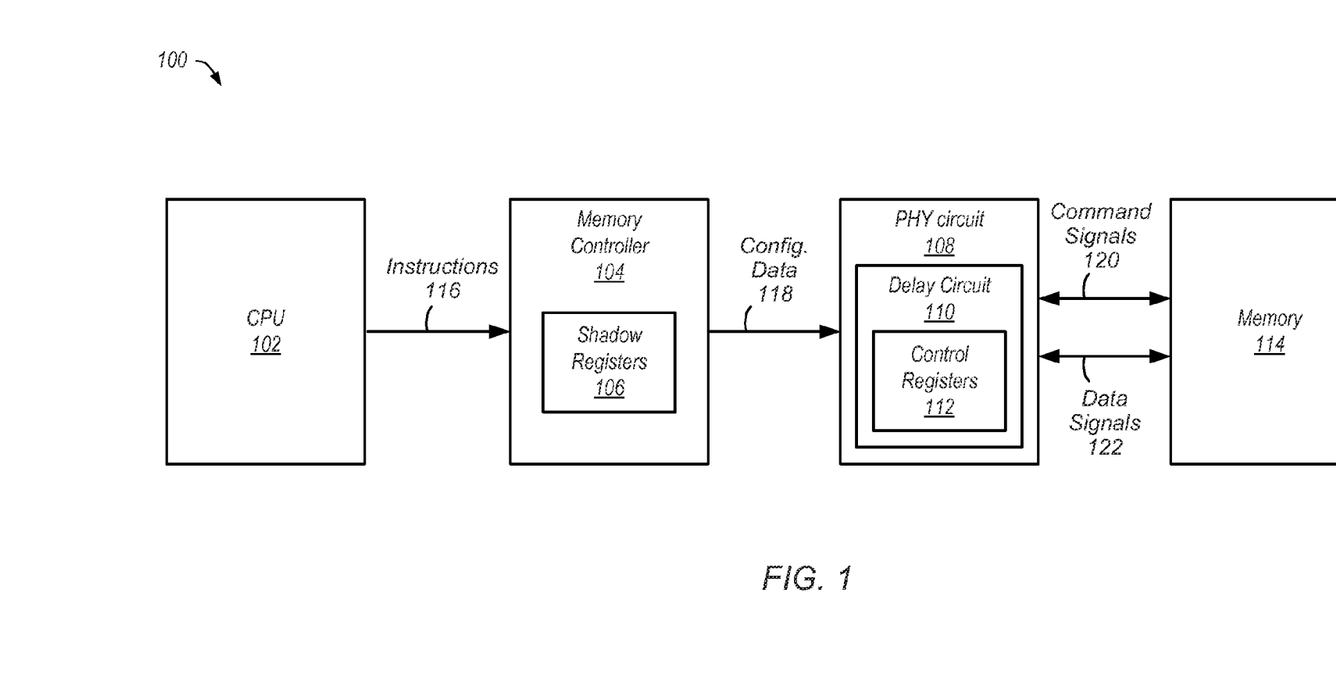
FIG. 1 is a block diagram illustrating one embodiment of an exemplary memory interface system.

This disclosure initially describes, with reference to FIG. 1, an embodiment of an exemplary memory interface system that includes a memory controller and PHY circuit. Different embodiments for routing configuration data to the PHY circuit are described with reference to FIGS. 2A and 2B. Components that may be included in the memory controller and the memory PHY circuit are described with reference to FIG. 3. A method performed by the memory controller is described with reference to FIG. 4. Finally, an exemplary computing system that includes a memory interface system is described with reference to FIG. 5.

Turning now to FIG. 1, a block diagram of one embodiment of an exemplary memory interface system 100 is shown. In the illustrated embodiment, the memory interface system 100 includes a central processing unit (CPU) 102, a memory controller 104, a physical layer (PHY) circuit 108 (e.g., a memory interface circuit), and a memory 114. The memory controller 104 includes one or more registers 106. In some embodiments, including the embodiment specifically illustrated in FIG. 1, the one or more registers 106 may be shadow registers, however other registers and circuits that may act as registers may also be used. The PHY circuit 108 includes one or more delay circuits 110. The one or more delay circuits 110 include one or more respective control registers 112. It is noted that the memory interface system 100 may be implemented differently than shown in FIG. 1 (as well as FIGS. 2A-4). Accordingly, in another embodiment, the one or more control registers 112 are separate from (and associated with) the one or more delay circuits 110. In another embodiment, the CPU 102, the memory 114, are external to the memory interface system 100. In another embodiment, the memory controller 104 is part of the CPU 102. In another embodiment, the PHY circuit 108 is part of the memory controller 104. In some embodiments, the one or more shadow registers 106 may be external to the memory controller 104.

In the illustrated embodiment, the memory 114 is configured to store data, which may be accessible by the CPU 102 via the memory controller 104 and the PHY circuit 108. The memory 114 may correspond to any suitable form of memory such as various volatile memories (e.g., random access memory (RAM), read only memory (ROM), etc.) or non-volatile memories (e.g., Flash memory, phase-change memory (PRAM), etc.). In various embodiments, the memory 114 may be configured to function in one of multiple operating states while servicing requests to read and write data. For example, in one embodiment, the memory 114 may support a "sleep" operating state (in which memory 114 is able to conserve power, but operates at a lower frequency (e.g., 30 MHz)) and a "normal" operating state (in which operates at a higher frequency (e.g., 1000 MHz), but consumes more power. In some embodiments, the operating state of the memory 114 may be based on an operating state of the computing system that includes the memory interface system 100. For example, in one embodiment, the computing system may be a mobile device that enters a sleep state when a user is not using the device. In such an embodiment, the memory 114 may be placed into the sleep operating state while the mobile device is in the sleep state, but the memory 114 may transition back to the normal operating state once the user begins interacting with the mobile device. In various embodiments, the memory 114 may indicate its particular operating state to the memory controller 104 via the PHY circuit 108 and identify when the memory 114 is transitioning between operating states (which may be communicated before the transition or after the transition). As will be described below, this information may be used by the memory controller 104 to coordinate reconfiguration of the PHY circuit 108 so that the PHY circuit 108 is able to communicate with the memory 114 after the memory 114 transitions to a new operating state.

The CPU 102 may provide a plurality of instructions 116 to the memory controller 104 (e.g., as part of executing one or more programs). In some instances, the instructions 116 may include requests to write data to the memory 114 and requests to read data from the memory 114. In other instances, instructions 116 may include instructions 116 to configure operations of memory controller 104, PHY circuit 108, and memory 114. Accordingly, in a particular embodiment, one of the instructions 116 may include a request to reconfigure the PHY circuit 108 that includes configuration data 118 addressed to the PHY circuit 108 (e.g., addresses one or more of the one or more control registers 112). As will be discussed below, this configuration data 118 may be usable by the PHY circuit 108 to interact with the memory 114 when the memory 114 is operating in a particular operating state. In some embodiments, when the memory 114 is about to transition to a new operating state, CPU 102 may communicate portions of configuration data 118 for the new operating state within multiple instructions 116, which may also be interspersed with normal read and write requests for the memory 114. As will be described below with respect to FIGS. 2A and 2B, the CPU 102 may obtain the configuration data 118 for the PHY circuit 108 from various sources.

The memory controller 104 may decode instructions 116 from the CPU 102 and issue corresponding to commands to the PHY circuit 108 to cause the PHY circuit 108 to interface with the memory 114. For example, upon receiving a read request, the memory controller 104 may issue commands to the PHY circuit 108 to generate a column address strobe (CAS) signal and a row address strobe (RAS) signal. In various embodiments, when the memory controller 104 receives an instruction 116 including configuration data addressed to the PHY circuit 108, the memory controller 104 may identify the configuration data (e.g., by identifying an address that corresponds to a particular register of the PHY circuit 108). In some embodiments, in response to identifying the configuration data, the memory controller 104 may intercept and store the configuration data (as opposed to immediately forwarding the configuration data to the PHY circuit 108). The memory controller 104 may then send or issue the configuration data to the PHY circuit 108 (shown as configuration data 118) in response to an indication that the memory 114 is switching operating states (or, in some embodiments, in response to an indication that a system that includes the memory interface system 100 is switching operating states, or in response to an instruction from the CPU 102 (e.g., a configuration write instruction) to provide the configuration data to the PHY circuit 108).

In the illustrated embodiment, the memory controller 104 stores the configuration data 118 in one or more of the shadow registers 106 within memory controller 104 that are shadow registers corresponding to respective control registers 112. Accordingly, in response to the memory 114 switching operating states (e.g., switching from a 30 MHz "sleep" operating state to a 1000 MHz "normal" operating state), the memory controller 104 may write the configuration data 118 to the one or more control registers 112 in the PHY circuit 108. As noted above, memory controller 104 may receive multiple instructions 116, each with a portion of configuration data 118 for a pending operating state change. As this configuration data 118 is received, memory controller 104 may use the shadow registers 106 to aggregate the configuration data 118 and then write the configuration data 118 as a single block to the one or more control registers 112. In some embodiments, this write may be performed as an atomic update. That is, the memory controller 104 may attempt to write the block of the configuration data 118 such that, if the write fails before completion, the write does not update the one or more control registers 112 and any written data is discarded. In a particular embodiment, the configuration data may be provided to the PHY circuit 108 using a same set of connections as used to cause the PHY circuit 108 to provide the control signals to the memory 114. As discussed further below, in one embodiment, by intercepting and storing the configuration data, the memory controller 104 may cause the PHY circuit 108 to be reconfigured more quickly once a memory operating state change occurs.

The PHY circuit 108 may handle the physical interfacing with the memory by receiving and transmitting one or more control signals to the memory 114. In the illustrated embodiment, the one or more control signals include the command signals 120, which specify commands for memory 114, and the data signals 122, which specify corresponding data for the commands. For example, the PHY circuit 108 may generate command signals 120 for a row address strobe and a column address strobe for a read operation. The PHY circuit 108 may then capture a corresponding data strobe signal (DQS) and a data signal 122 (DQ) received from the memory 114. To correctly communicate with the memory 114, the PHY circuit 108 may adjust the timing of the command signals 120, the data signals 122, or both (one or more signals provided to the memory 114, received from the memory 114, or both), to account for synchronization errors that may be introduced due to changes in the operating state of the memory 114 or due to ambient characteristics such as changes in temperature for the memory interface system 100, the operating voltages for the memory interface system 100, etc. For example, if DQS is out of synchronization with DQ, the PHY circuit 108 may adjust the timing of DQS.

In various embodiments, the one or more delay circuits 110 are configured to make the adjustments to the command signals 120, the data signals 122, or both, by introducing delays into the command signals 120, the data signals 122, or both (e.g., using one or more delay locked loops (DLLs)). In the illustrated embodiment, the one or more delay circuits 110 introduces delays based on one or more delay codes specified in configuration data 118 and stored at the one or more control registers 112. In many instances, the delay codes applicable for a particular operating state of memory 114 may differ from those of another operating state of the memory 114. As a result, memory controller 104 may update the delay codes in the one or more control registers 112 with the delay codes stored in respective shadow registers 106 once the operating state of the memory 114 changes, for example, from a sleep state to a normal operating state.

In various embodiments, the PHY circuit 108 (or memory controller 104 in another embodiment) may periodically scale the one or more delay codes in the one or more control registers 112 based on detected changes in one or more ambient characteristics such as the present temperature, the present operating voltage, etc. In some embodiments, the delay codes specified in configuration data 118 may be codes that were previously being used by the PHY circuit 108 when the PHY circuit 108 last operated in a particular state. For example, upon the memory 114 leaving a particular state, the delay codes in the one or more control registers 112 may be recorded elsewhere in the memory interface system 100 (as discussed in FIGS. 2A and 2B). In response to the memory 114 returning to the particular state, the codes may be retrieved and written back in to the one or more control registers 112. In other embodiments, the delay codes specified by configuration data 118 may be default codes for a particular state (as opposed to codes that were previously determined by the PHY circuit 108).

As noted above, storing the configuration data 118 at a proximal location to PHY circuit 108 (i.e., in the memory controller 104) may enable the memory interface system 100 to process at least some memory requests more quickly after memory changes its operating state, as compared to a system where the configuration data is forwarded to the PHY circuit from a location that is further away. Additionally, the memory controller 104 may be able to send collected configuration data 118 to the PHY circuit 108 more efficiently (e.g., as a part of a batch packet using fewer transmissions), as compared to the system where the configuration data is periodically forwarded to the PHY circuit over a much longer interval.

Figure 2A:
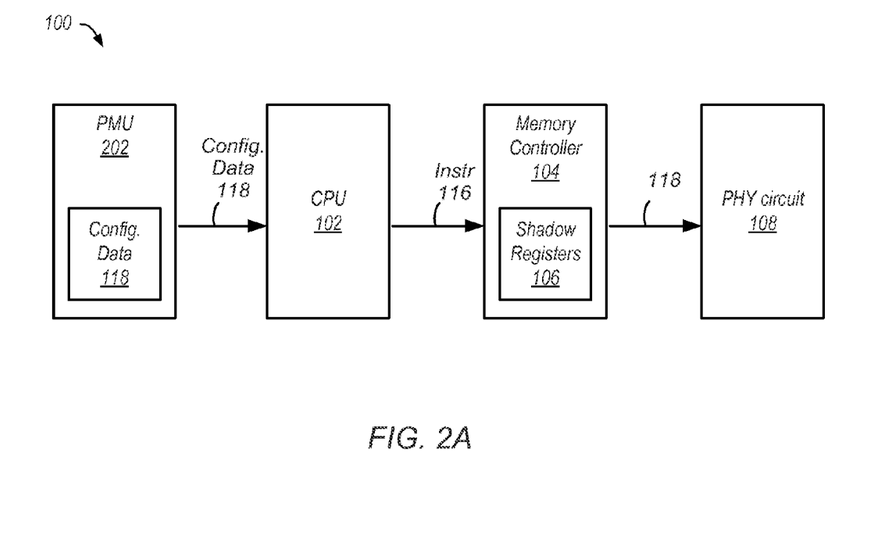
FIGS. 2A-B are block diagrams illustrating embodiments of communicating configuration information within the exemplary memory interface system.

Turning now to FIG. 2A, a block diagram illustrating an exemplary embodiment for communicating configuration data 118 in a memory interface system 100 is shown. In the illustrated embodiment, the memory interface system 100 further includes a power management unit 202. To improve clarity, the one or more delay circuit 110 and memory 114 are omitted from FIG. 2A. As shown, configuration data 118 may initially be stored in registers within a power management unit (PMU) 202. When memory 114 is about to transition to a new operating state, the PMU 202 may transmit the configuration data 118 to the CPU 102 (e.g., in response to a request from the CPU 102), which may generate an instruction 116 and store the configuration data 118 at the one or more shadow registers 106. In response to the memory 114 switching operating states, the memory controller 104 may provide the configuration data 118 to the PHY circuit 108. Although FIG. 2A illustrates the configuration data 118 as being stored at the PMU 202, in other embodiments, the configuration data 118 may additionally or alternatively be stored at another device (e.g., in the CPU 102 or in another memory device connected to the CPU 102), as further discussed below with reference to FIG. 2B.

Figure 2B:
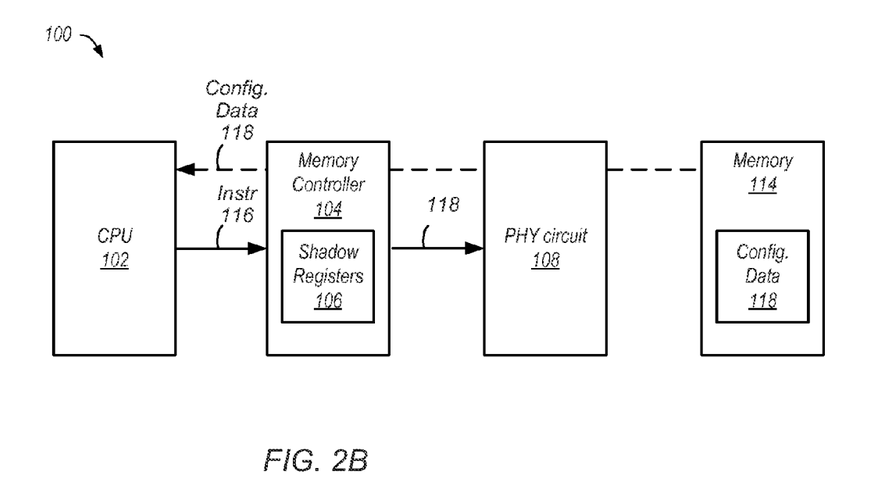

Turning now to FIG. 2B, a block diagram illustrating another exemplary embodiment for communicating the configuration data 118 in a memory interface system 100 is shown. To improve clarity, portions of the memory interface system 100 may not be shown. In the illustrated embodiment, the configuration data 118 is initially stored in the memory 114. Before the memory 114 transitions between operating states, the memory 114 may transmit the configuration data 118 to the CPU 102 (e.g., in response to a request from the CPU 102), which may generate the instruction 116 based on the configuration data 118. Again, the memory controller 104 may extract the configuration data 118 from the instruction 116 and store the configuration data 118 at the one or more shadow registers 106. In response to the memory 114 switching operating states, the memory controller 104 may provide the configuration data 118 to the PHY circuit 108.

In some embodiments, other methods of providing the configuration data 118 to the memory controller 104 may be performed. For example, in one embodiment, the CPU 102 may instruct the memory controller 104 to intercept the configuration data 118 rather than the memory controller 104 passing the configuration data 118 to the CPU 102 and the CPU 102 generating the instruction 116. As another example, the memory controller 104 may be configured to inspect data received from the memory 114 and to recognize and store the configuration data 118 from the memory 114.

Figure 3:
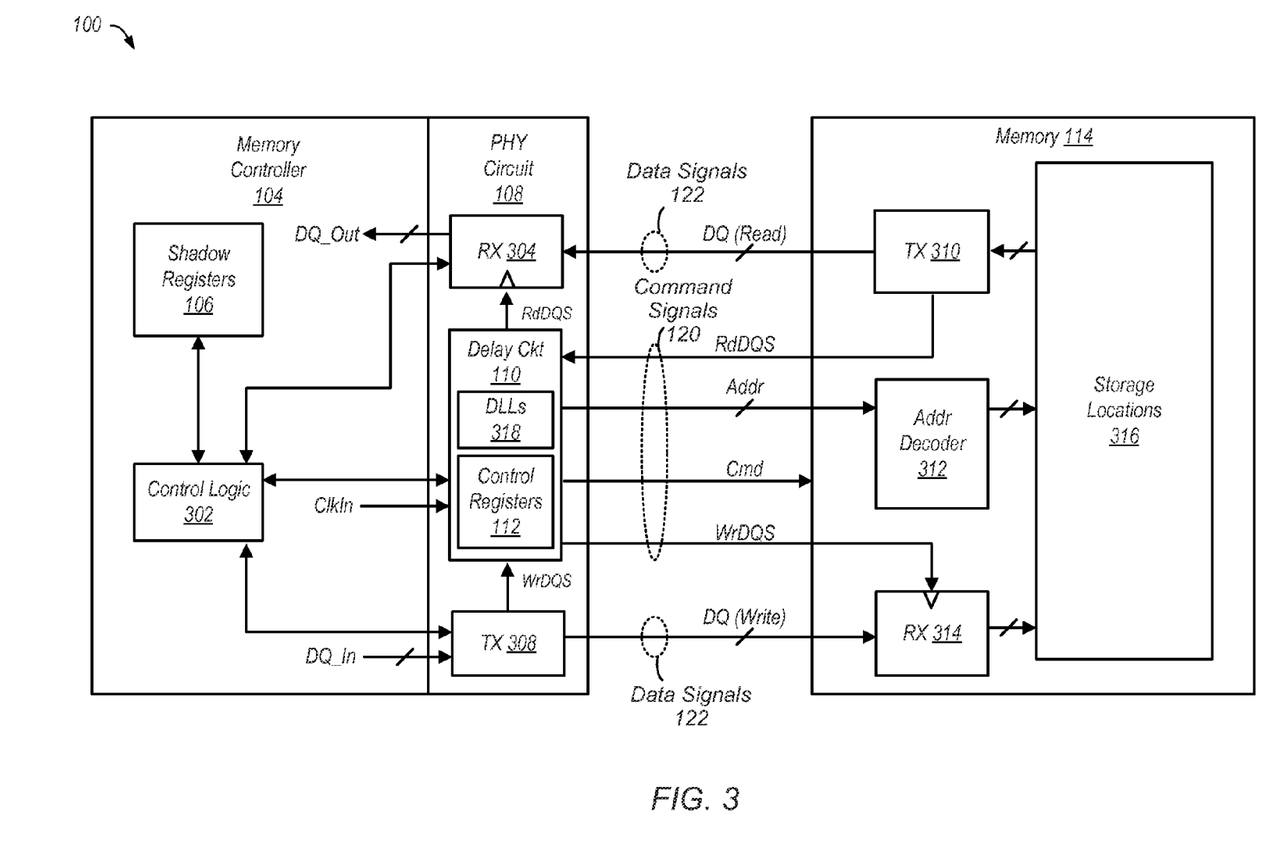
FIG. 3 is a block diagram illustrating one embodiment of a memory controller and physical interface (PHY) circuit interacting with a memory in the exemplary memory system.

Turning now to FIG. 3, a block diagram of an exemplary embodiment of components within the memory controller 104, the PHY circuit 108, and the memory 114 are shown. In the illustrated embodiment, the memory controller 104 further includes control logic 302. The PHY circuit 108 further includes a receiver (RX) 304, one or more delay locked loops (DLLs) 318, and a transmitter (TX) 308. The memory 114 includes a TX 310, an address decoder 312, a RX 314, and storage locations 316. Although FIG. 3 illustrates a particular arrangement of circuitry, in other embodiments, portions of the memory interface system 100 may be arranged in other ways. For example, in one embodiment, the one or more delay circuits 110 may be included in the memory 114. Although not explicitly shown, the memory interface system 100 may include additional logic for receiving memory requests, such as logic configured to enable selected storage locations for read and write operations.

As described above with reference to FIGS. 1-2B, the memory controller 104 may decode instructions 116 including memory requests from the CPU 102 and cause the PHY circuit 108 to provide control signals to the memory 114 (e.g., the command signals 120 and the data signals 122) in response to the memory requests. The memory controller 104 may intercept and store, at the one or more shadow registers 106, configuration data that addresses the PHY circuit 108 (e.g., addresses the one or more control registers 112) and corresponds to a different operating state of the memory 114. In the illustrated embodiment, the control logic 302 identifies the configuration data 118 and forwards the configuration data 118 to the one or more shadow registers 106. Additionally, the control logic 302 may recognize that the memory 114 is switching to the different operating state (e.g., based on an indication from a processor, from the memory 114, or from another device) and provide the configuration data 118 from the one or more shadow registers 106 to the one or more control registers 112. Prior to sending the configuration data 118 to the one or more control registers 112, the control logic 302 may modify the configuration data 118 based on one or more ambient characteristics of the memory interface system 100 (e.g., scaling the configuration data 118 based on a voltage and a temperature of the memory system). The control logic 302 may further provide one or more control signals to the shadow registers 106, the RX 304, the one or more delay circuits 110, the TX 308, or any combination thereof.

As described above with reference to FIGS. 1-2B, the PHY circuit 108 may provide one or more control signals (e.g., the command signals 120 and the data signals 122) to the memory 114. As illustrated in FIG. 3, the command signals 120 may include a read data strobe signal (RdDQS) that synchronizes read requests with the memory 114, a plurality of address signals (Addr) that correspond to memory addresses of the memory 114, a command signal (Cmd) corresponding to a memory request instruction, and a write data strobe signal (WrDQS) that synchronizes write requests with the memory 114. The data signals 122 may include a plurality of read data signals (DQ (Read)) and/or a plurality of write data signals (DQ (Write)). Some signals may be unused based on a type of memory request (e.g., WrDQS may be unused during a read request). In some embodiments, the RX 304 may receive the plurality of read data signals from the memory 114 provide the plurality of read data signals to the memory controller 104. The TX 308 may receive the plurality of write data signals from the memory controller 104 and provide the plurality of write data signals to the memory 114.

As described above, the one or more delay circuits 110 may delay one or more of the command signals 120, the data signals 122, or both, based on an input clock signal (ClkIn) and one or more delay codes stored at the one or more control registers (e.g., to synchronize the memory controller 104 with the memory 114). The delays may be generated using the one or more DLLs 318. In the embodiment shown, the one or more delay circuits 110 is associated with several separate delay paths. In a first delay path, the one or more delay circuits 110 may generate the read data strobe signal sent to the RX 304 based on applying a delay corresponding to a delay code from the one or more control registers 112 to the read data strobe received from the TX 310. In a second delay path, the one or more delay circuits 110 may generate the write data strobe signal sent to the RX 314 based on applying a delay corresponding to a delay code from the one or more control registers 112 to the write data strobe received from the TX 308. In a third delay path, the delay circuit may apply a delay to an address signal, a command signal, or both, received from the memory controller 104. While the memory 114 operates in a first operating state, the delay codes stored at the one or more control registers 112 may correspond to one or more default delay values or may be determined during one or more calibration procedures. Accordingly, the one or more delay circuits 110 may be configured to operate according to a default configuration setting prior to receiving the configuration data. When the memory 114 transitions to a second operating state, the one or more control registers 112 may receive different delay codes (e.g., corresponding to configuration data) from the memory controller 104 (e.g., from the one or more shadow registers 106). Thus, the configuration data causes the one or more delay circuits 110 to operate according to another configuration setting indicated by the configuration data. The delay codes may be received as part of an atomic update of the one or more control registers 112. In some embodiments, the one or more delay circuits 110 or another portion of the PHY circuit 108 may be configured to modify or scale the one or more delay codes based on one or more ambient characteristics of the memory interface system 100.

As described above with reference to FIGS. 1-2B, the memory 114 may store data corresponding to the data signals 122, provide the data signals 122, or both in response to memory requests received from the PHY circuit 108. As described above, the TX 310 and the RX 314 may coordinate with the PHY circuit 108 to synchronize read operations and write operations, respectively, with the memory controller 104. The address decoder 312 may identify one or more memory locations of the storage locations 316 corresponding to a memory request. The memory 114 may operate in several different operating states (e.g., corresponding to different clock frequencies). In response to the memory 114 switching operating states (e.g., based on a request received from the PHY circuit 108), the memory 114 may signal to the PHY circuit 108 that the memory 114 is transitioning between operating states (e.g., before the memory 114 switches operating states or after the memory 114 switches operating states). In some embodiments, the memory 114 may be unavailable to respond to memory requests while the memory 114 is switching operating states.

Accordingly, the memory interface system 100 may store configuration information (e.g., configuration data) that addresses the one or more control registers 112 at the one or more shadow registers 106 until the memory 114 switches to a different operating state. Storing the configuration data at the one or more shadow registers 106 may enable the memory interface system 100 to process at least some memory requests more quickly, as compared to a system that blocks traffic to a memory while forwarding new configuration information to a PHY circuit (i.e., where the configuration information is immediately forwarded to the one or more control registers). Also, as described above, storing the configuration data at the one or more shadow registers 106 may also mitigate a potential deadlock scenario where the configuration information writes are blocked by memory requests that are blocked, waiting for the configuration information writes to complete. Additionally, the memory controller 104 may be able to send collected configuration information to the PHY circuit 108 more efficiently (e.g., using one transmission), as compared to the system where the configuration information is immediately forwarded to the PHY circuit (e.g., using 50 separate transmissions).

Figure 4:
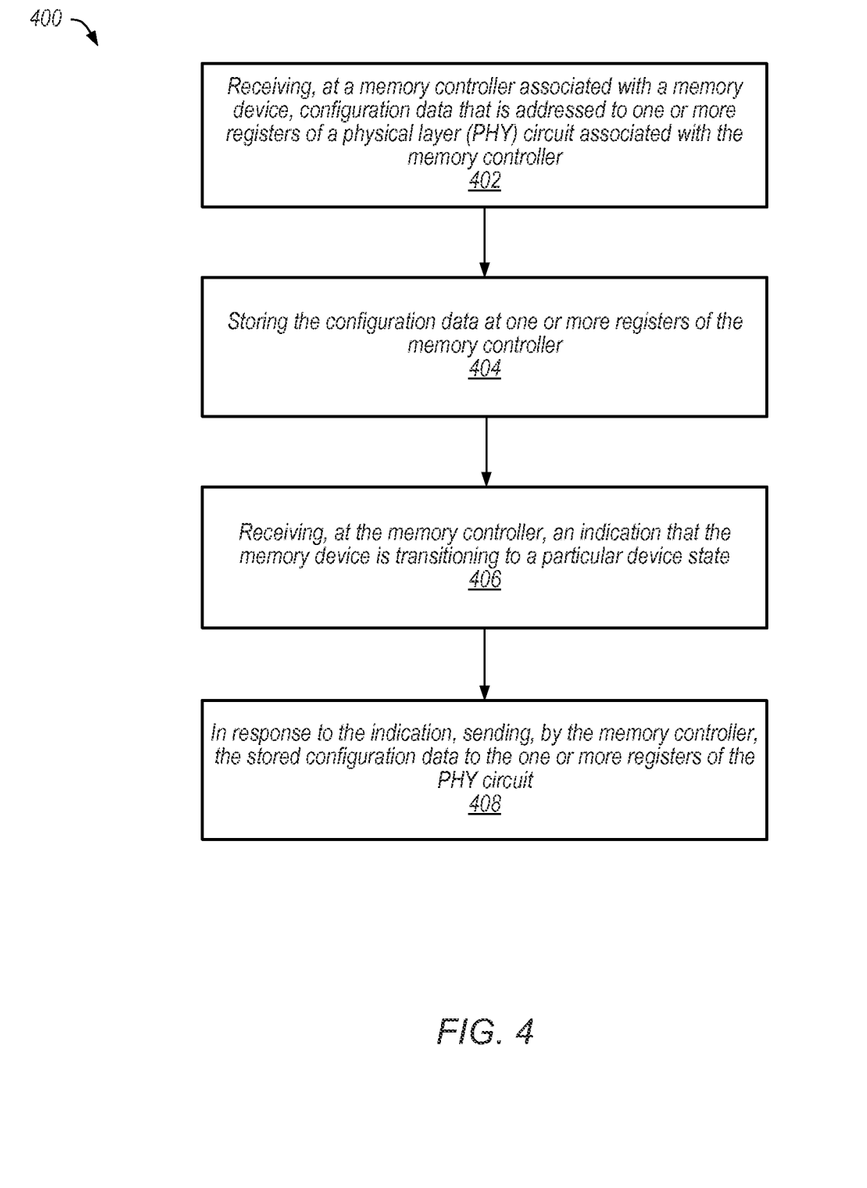
FIG. 4 is a flow diagram illustrating an embodiment of a method of operating a memory interface system.

Turning now to FIG. 4, a flow diagram of a method 400 is depicted. Method 400 is an embodiment of a method of operating a memory interface system, such as the memory interface system 100. In some embodiments, the method 400 may be initiated or performed by one or more processors in response to one or more instructions stored by a computer-readable storage medium.

At 402, the method 400 includes receiving, at a memory controller associated with a memory device, configuration data that is addressed to one or more registers of a physical layer (PHY) circuit associated with the memory controller. For example, the method 400 may include receiving, at the memory controller 104 of FIG. 1 associated with the memory 114, the configuration data 118 (e.g., as part of the instructions 116) that is addressed to one or more of the control registers 112 of the PHY circuit 108.

At 404, the method 400 includes storing the configuration data at one or more registers of the memory controller. For example, the method 400 may include storing the configuration data 118 at the shadow registers 106.

At 406, the method 400 includes receiving, at the memory controller, an indication that the memory device is transitioning to a particular device state. For example, the method 400 may include the memory controller 104 receiving an indication that the memory 114 is transitioning to a particular operating state. In some embodiments, the memory device transitioning to the particular operating state corresponds to a system that includes the memory controller, the PHY circuit, and the memory device leaving a sleep state. In some embodiments, the indication corresponds to the memory device being unable to process memory requests for a particular duration (e.g., because the memory device is changing clock states).

At 408, the method 400 includes in response to the indication, sending, by the memory controller, the stored configuration data to the one or more registers of the PHY circuit. For example, the method 400 may include, in response to the indication, the memory controller 104 sending the configuration data 118 from the shadow registers 106 to the one or more of the control registers 112.

In some embodiments, prior to receiving the indication, the memory controller may receive additional configuration data. The additional configuration data may address one or more different registers of the PHY circuit than the configuration data. For example, the additional configuration data may address one or more different registers of the one or more control registers 112. Alternatively, the additional configuration data may address the same registers of the PHY circuit as the configuration data (e.g., updating the configuration data). The additional configuration data may be stored at one or more different registers of the memory controller. For example, the additional configuration data may be stored at one or more different shadow registers of the shadow registers 106. Alternatively, the additional configuration data may be stored at the one or more registers of the memory controller (e.g., overwriting the configuration data). In response to the indication, the memory controller may send the additional configuration data to the addressed registers of the PHY circuit.

Figure 5:
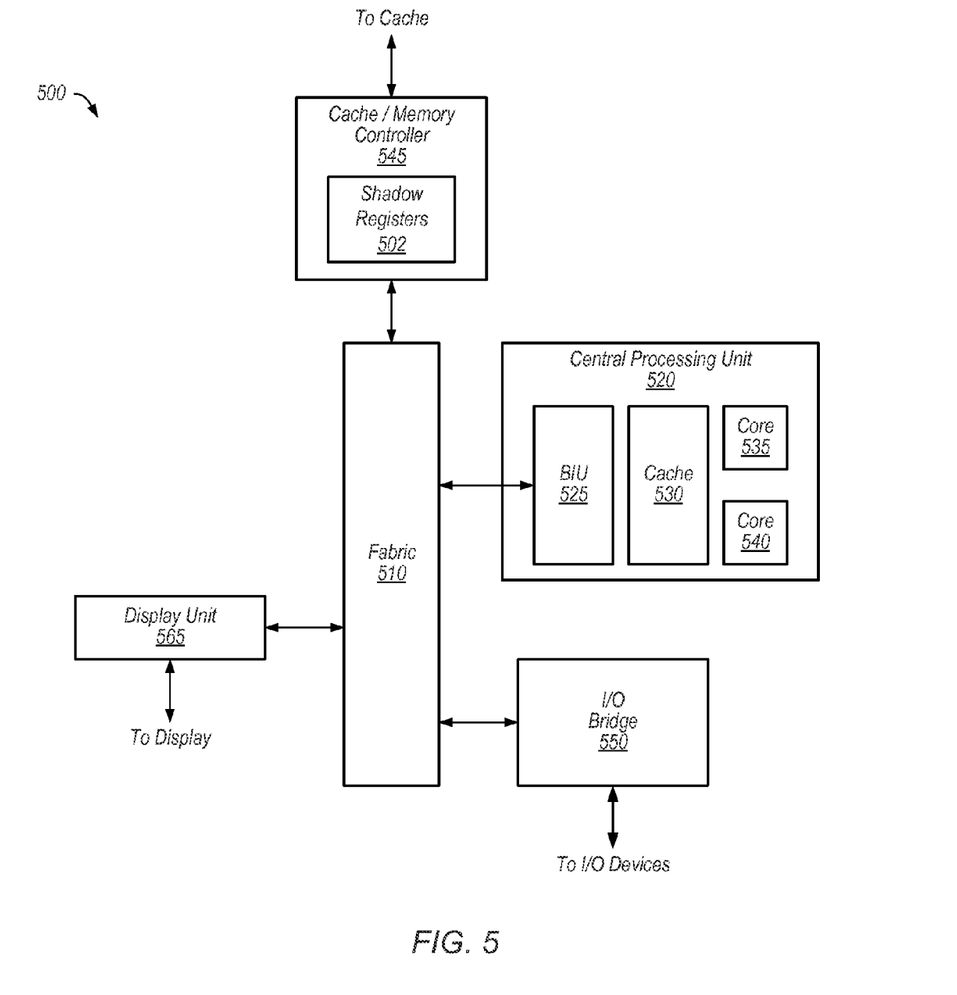
FIG. 5 is a block diagram illustrating an embodiment of an exemplary computing system that includes a memory interface system.

Turning next to FIG. 5, a block diagram illustrating an exemplary embodiment of a computing system 500 is shown. The computing system 500 is an embodiment of a computing system that includes a memory interface system. In some embodiments, the memory interface system of FIG. 5 corresponds to the memory interface system 100 described above with reference to FIG. 1. For example, the computing system 500 includes a central processing unit (CPU) complex 520, a cache/memory controller 545, and shadow registers 502. In some embodiments, the CPU complex 520 corresponds to the CPU 102 of FIG. 1, the cache/memory controller 545 corresponds to (e.g., includes) the memory controller 104 and the PHY circuit 108, and the shadow registers 502 correspond to the shadow registers 106. Additionally or alternatively, the computing system 500 may include one or more other memory interface systems described above with reference to FIGS. 1-4, including any variations or modifications described previously with reference to FIGS. 1-4. In some embodiments, some or all elements of the computing system 500 may be included within a system on a chip (SoC). In some embodiments, computing system 500 is included in a mobile device. Accordingly, in at least some embodiments, power consumption and memory access speed of the computing system 500 may be important design considerations. In the illustrated embodiment, the computing system 500 includes fabric 510, the CPU complex 520, input/output (I/O) bridge 550, the cache/memory controller 545, and display unit 565.

Fabric 510 may include various interconnects, buses, MUXes, controllers, etc., and may be configured to facilitate communication between various elements of computing system 500. In some embodiments, portions of fabric 510 are configured to implement various different communication protocols. In other embodiments, fabric 510 implements a single communication protocol and elements coupled to fabric 510 may convert from the single communication protocol to other communication protocols internally.

In the illustrated embodiment, CPU complex 520 includes bus interface unit (BIU) 525, cache 530, and cores 535 and 540. In various embodiments, CPU complex 520 includes various numbers of cores and/or caches. For example, CPU complex 520 may include 1, 2, or 4 processor cores, or any other suitable number. In some embodiments, CPU complex 520 includes one or more memory interface systems or one or more portions of one or more memory interface systems (e.g., associated with caches of the CPU complex 520). In some embodiments, cores 535 and/or 540 include internal instruction and/or data caches. In some embodiments, a coherency unit (not shown) in fabric 510, cache 530, or elsewhere in computing system 500 is configured to maintain coherency between various caches of computing system 500. BIU 525 may be configured to manage communication between CPU complex 520 and other elements of computing system 500. Processor cores such as cores 535 and 540 may be configured to execute instructions of a particular instruction set architecture (ISA), which may include operating system instructions and user application instructions.

Cache/memory controller 545 may be configured to manage transfer of data between fabric 510 and one or more caches and/or memories (e.g., non-transitory computer readable mediums). For example, cache/memory controller 545 may be coupled to an L3 cache, which may, in turn, be coupled to a system memory. In other embodiments, cache/memory controller 545 is directly coupled to a memory. In some embodiments, the cache/memory controller 545 includes one or more internal caches. In some embodiments, the cache/memory controller 545 may include or be coupled to one or more caches and/or memories that include instructions that, when executed by one or more processors (e.g., the CPU complex 520 and/or one or more cores 535, 540 of the CPU complex 520), cause the processor, processors, or cores to initiate or perform some or all of the processes described above with reference to FIG. 4. In some embodiments, one or more caches and/or memories coupled to the cache/memory controller 545 are associated with the memory interface system of FIG. 5 (e.g., associated with the shadow registers 502).

As used herein, the term "coupled to" indicates one or more connections between elements, and a coupling may include intervening elements. For example, in FIG. 5, display unit 565 may be described as "coupled to" the CPU complex 520 through fabric 510. In contrast, in the illustrated embodiment of FIG. 5, display unit 565 is "directly coupled" to fabric 510 because there are no intervening elements.

Display unit 565 may be configured to read data from a frame buffer and provide a stream of pixel values for display. Display unit 565 may be configured as a display pipeline in some embodiments. Additionally, display unit 565 may be configured to blend multiple frames to produce an output frame. Further, display unit 565 may include one or more interfaces (e.g., MIPI® or embedded display port (eDP)) for coupling to a user display (e.g., a touchscreen or an external display).

I/O bridge 550 may include various elements configured to implement: universal serial bus (USB) communications, security, audio, and/or low-power always-on functionality, for example. I/O bridge 550 may also include interfaces such as pulse-width modulation (PWM), general-purpose input/output (GPIO), serial peripheral interface (SPI), and/or inter-integrated circuit (I2C), for example. Various types of peripherals and devices may be coupled to computing system 500 via I/O bridge 550.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. An apparatus, comprising:
   a memory interface circuit configured to communicate with a memory device; and
   a memory controller configured to:
      while the memory device is operating at a first frequency, intercept and store configuration information that addresses the memory interface circuit, wherein the configuration information corresponds to the memory device operating at a second frequency; and
      in response to the memory device transitioning to the second frequency, send the intercepted configuration information to the memory interface circuit.

2. The apparatus of claim 1, wherein the configuration information is configured to cause the memory interface circuit to adjust a timing of one or more signals provided to the memory device, received from the memory device, or both.

3. The apparatus of claim 1, wherein the memory controller is further configured, after storing the configuration information and prior to sending the configuration information, to provide one or more memory requests that address the memory device to the memory interface circuit via one or more connections.

4. The apparatus of claim 3, wherein the memory controller is configured to send the configuration information to the memory interface circuit via the one or more connections.

5. The apparatus of claim 1, further comprising a power management unit (PMU) configured to:
   prior to the memory device operating at the first frequency, store the configuration information; and
   in response to the memory device operating at the first frequency, provide the configuration information to the memory controller.

6. The apparatus of claim 1, wherein the memory controller is further configured to receive the configuration information from the memory device.

7. The apparatus of claim 1, wherein the memory controller is further configured to send the configuration information to the memory interface circuit while the memory device operates at the first frequency in response to receiving a configuration write instruction.

8. A method, comprising:
   receiving, at a memory controller associated with a memory device, configuration data that is addressed to one or more registers of a physical layer (PHY) circuit associated with the memory controller;
   storing the configuration data at one or more registers of the memory controller;
   receiving, at the memory controller, an indication that the memory device is transitioning into a particular operating state; and
   in response to the indication, sending, by the memory controller, the stored configuration data from the one or more registers of the memory controller to the one or more registers of the PHY circuit.

9. The method of claim 8, wherein the memory device transitioning to the particular operating state corresponds to a system that includes the memory controller, the PHY circuit, and the memory device leaving a sleep state.

10. The method of claim 8, wherein the indication corresponds to the memory device being unable to process memory requests for a particular duration.

11. The method of claim 8, further comprising, prior to receiving the indication:
    receiving, at the memory controller, additional configuration data that is addressed to one or more different registers of the PHY circuit;
    storing at the one or more different registers of the memory controller, the additional configuration data; and
    in response to the indication, sending, by the memory controller, the additional configuration data to the one or more different registers of the PHY circuit with the configuration data as part of a batch packet.

12. An apparatus, comprising:
    a physical layer (PHY) circuit configured to send one or more memory instructions to a memory device, wherein the PHY circuit comprises one or more delay circuits; and
    a memory controller coupled to the PHY circuit, comprising:
       shadow registers configured to store, based on the memory device operating at a first frequency, configuration data addressed to the PHY circuit, wherein the configuration data corresponds to the one or more delay circuits; and
       control logic configured to provide the stored configuration data from the shadow registers of the memory controller to the PHY circuit based on the memory device operating at a second frequency.

13. The apparatus of claim 12, wherein the shadow registers correspond to respective delay circuits of the one or more delay circuits, and wherein the shadow registers are configured to store configuration data that addresses one or more registers of the respective delay circuits.

14. The apparatus of claim 12, wherein the one or more delay circuits are configured to operate according to a default configuration setting prior to receiving the configuration data, and wherein the configuration data is configured to cause the one or more delay circuits to operate according to another configuration setting indicated by the configuration data.

15. The apparatus of claim 12, wherein the one or more delay circuits include one or more delay locked loop (DLL) configuration registers, and wherein the configuration data indicates one or more delays corresponding to at least one of the one or more DLL configuration registers.

16. The apparatus of claim 15, wherein providing the configuration data comprises an atomic update to all DLL configuration registers of the PHY circuit.

17. The apparatus of claim 15, wherein a particular DLL circuit is configured to delay a data strobe signal (DQS) to the memory device based on a delay code stored at a respective DLL configuration register, wherein the delay code is specified in the configuration data.

18. The apparatus of claim 15, wherein a particular DLL circuit is configured to delay, based on a delay code, a data strobe signal (DQS) received from the memory device in response to a read request, wherein the delay code is specified in the configuration data.

19. The apparatus of claim 12, wherein the PHY circuit is configured to scale one or more portions of the configuration data based on a temperature of the memory device, a voltage level of the memory device, or both.

* * * * *